US012436188B2

(12) United States Patent
Nukanobu et al.

(10) Patent No.: US 12,436,188 B2
(45) Date of Patent: Oct. 7, 2025

(54) LED CHUCK

(71) Applicant: TOKYO ELECTRON LIMITED, Tokyo (JP)

(72) Inventors: Tomoki Nukanobu, Nirasaki (JP); Hiroyuki Nakayama, Nirasaki (JP); Shigeru Kasai, Nirasaki (JP); Yoshiyuki Morifuji, Nirasaki (JP); Dai Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 18/282,744

(22) PCT Filed: Mar. 16, 2022

(86) PCT No.: PCT/JP2022/011973
§ 371 (c)(1),
(2) Date: Sep. 18, 2023

(87) PCT Pub. No.: WO2022/209903
PCT Pub. Date: Oct. 6, 2022

(65) Prior Publication Data

US 2024/0159825 A1 May 16, 2024

(30) Foreign Application Priority Data

Mar. 30, 2021 (JP) ................................ 2021-057160

(51) Int. Cl.
*G01R 31/311* (2006.01)

(52) U.S. Cl.
CPC ................................ *G01R 31/311* (2013.01)

(58) Field of Classification Search
CPC .............. G01R 31/311; G01R 31/2875; G01R 31/2865; H05B 3/0038; H05B 1/023; H05B 45/30; H10H 20/858
See application file for complete search history.

(56) References Cited

U.S. PATENT DOCUMENTS

2005/0035311 A1* 2/2005 Asakawa .............. G01N 21/95 250/559.16
2016/0154193 A1* 6/2016 Brukilacchio ......... G02B 5/003 385/33

(Continued)

FOREIGN PATENT DOCUMENTS

JP 2018-151369 A 9/2018

OTHER PUBLICATIONS

PCT International Search Report and Written Opinion, PCT Application No. PCT/JP2022/011973, May 24, 2022, 11 pages (with English translation of PCT International Search Report).

*Primary Examiner* — Lee E Rodak
*Assistant Examiner* — Zannatul Ferdous
(74) *Attorney, Agent, or Firm* — Fenwick & West LLP

(57) ABSTRACT

There is provided an LED chuck comprising: a top plate on which an object to be inspected is mounted; an LED array substrate disposed to face the object to be inspected, and provided with a plurality of LEDs for heating the object to be inspected that is mounted on the top plate; a cooling plate disposed on a back side of the LED array substrate; an LED control substrate disposed on a back side of the cooling plate and controlling the plurality of LEDs; and a base plate disposed to surround the LED control substrate. A surface of the cooling plate facing the LED control substrate and a surface of the base plate facing the LED control substrate are formed of a magnetic material.

13 Claims, 6 Drawing Sheets

10
13
14
12
23

(56) References Cited

U.S. PATENT DOCUMENTS

2021/0156891 A1* 5/2021 Kobayashi ......... G01R 1/07314
2021/0247248 A1* 8/2021 Kobayashi ............. G01K 1/026

* cited by examiner 13
20
19
21
22
14
W
30
15
16
11
12
18
23

LED CHUCK

TECHNICAL FIELD

An exemplary embodiment of the present disclosure relates to an LED chuck.

BACKGROUND

As an electronic-device inspection apparatus for inspecting an electronic device, there is an electronic-device inspection apparatus (e.g., Patent Document 1) that emits light from an LED to heat the electronic device.

PRIOR ART DOCUMENTS

Patent Documents

Patent Document 1: Japanese Laid-open Patent Publication No. 2018-151369

SUMMARY

Problems to Be Resolved by the Invention

The present disclosure provides a technology for preventing noise generated when an LED emits light from being transferred to the outside.

Means for Solving the Problems

In one exemplary embodiment, an LED chuck is provided. The LED chuck includes a top plate on which an object to be inspected is mounted, an LED array substrate disposed to face the object to be inspected and provided with a plurality of LEDs for heating the object to be inspected that is mounted on the top plate, a cooling plate disposed on a back side of the LED array substrate, an LED control substrate disposed on a back side of the cooling plate and controlling the plurality of LEDs, and a base plate disposed to surround the LED control substrate. A surface of the cooling plate facing the LED control substrate and a surface of the base plate facing the LED control substrate are formed of a magnetic material.

Effect of the Invention

The present disclosure provides a technology for preventing noise generated when an LED emits light from being transferred to the outside.

DETAILED DESCRIPTION

Figure 1:
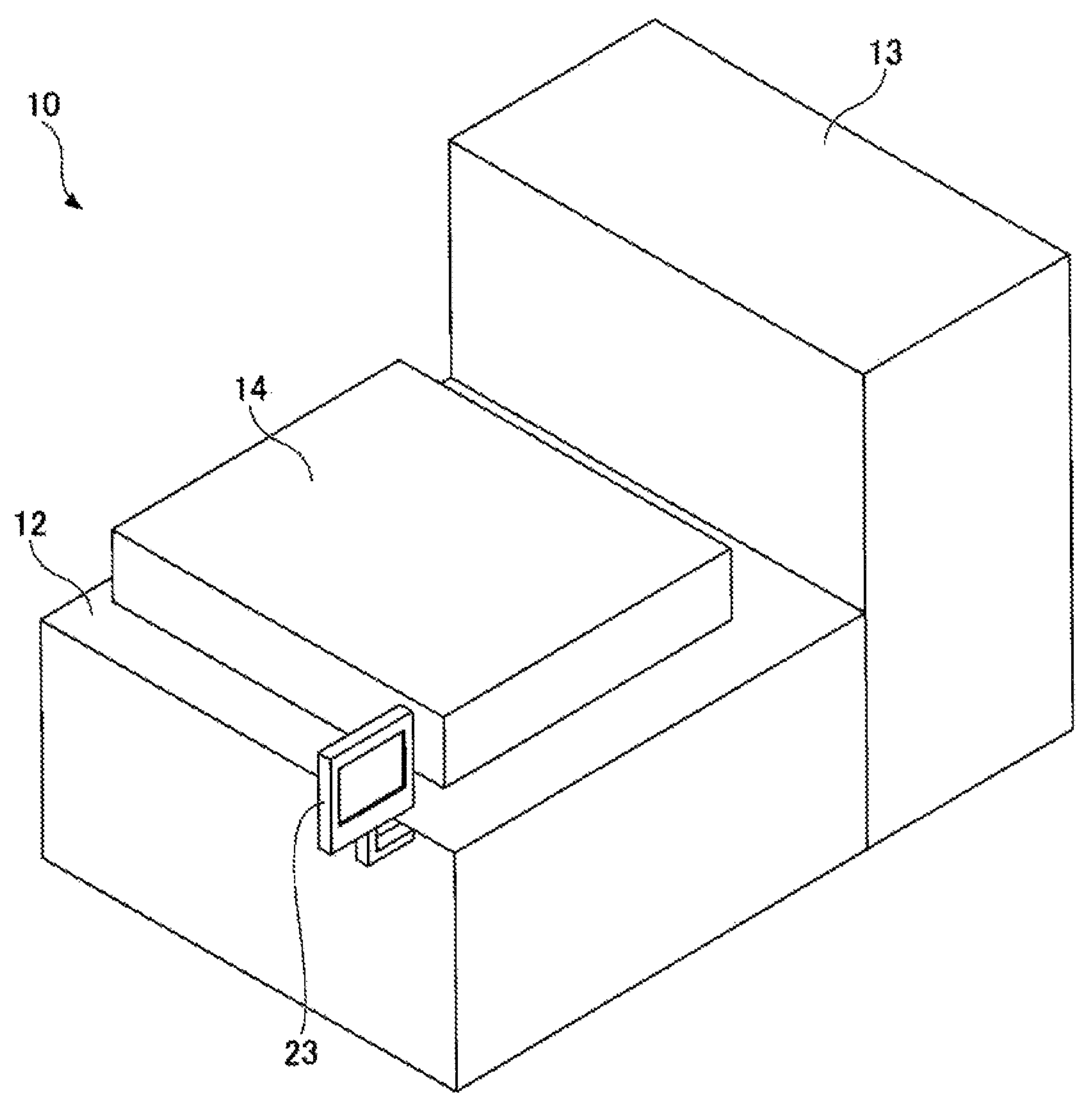
FIG. 1 is a perspective view of an electronic-device inspection apparatus according to the present embodiment.

Hereinafter, exemplary embodiments of the present disclosure will be described with reference to the accompanying drawings. Further, the same reference numerals are used throughout the drawings to designate the same or similar components.

Figure 2:
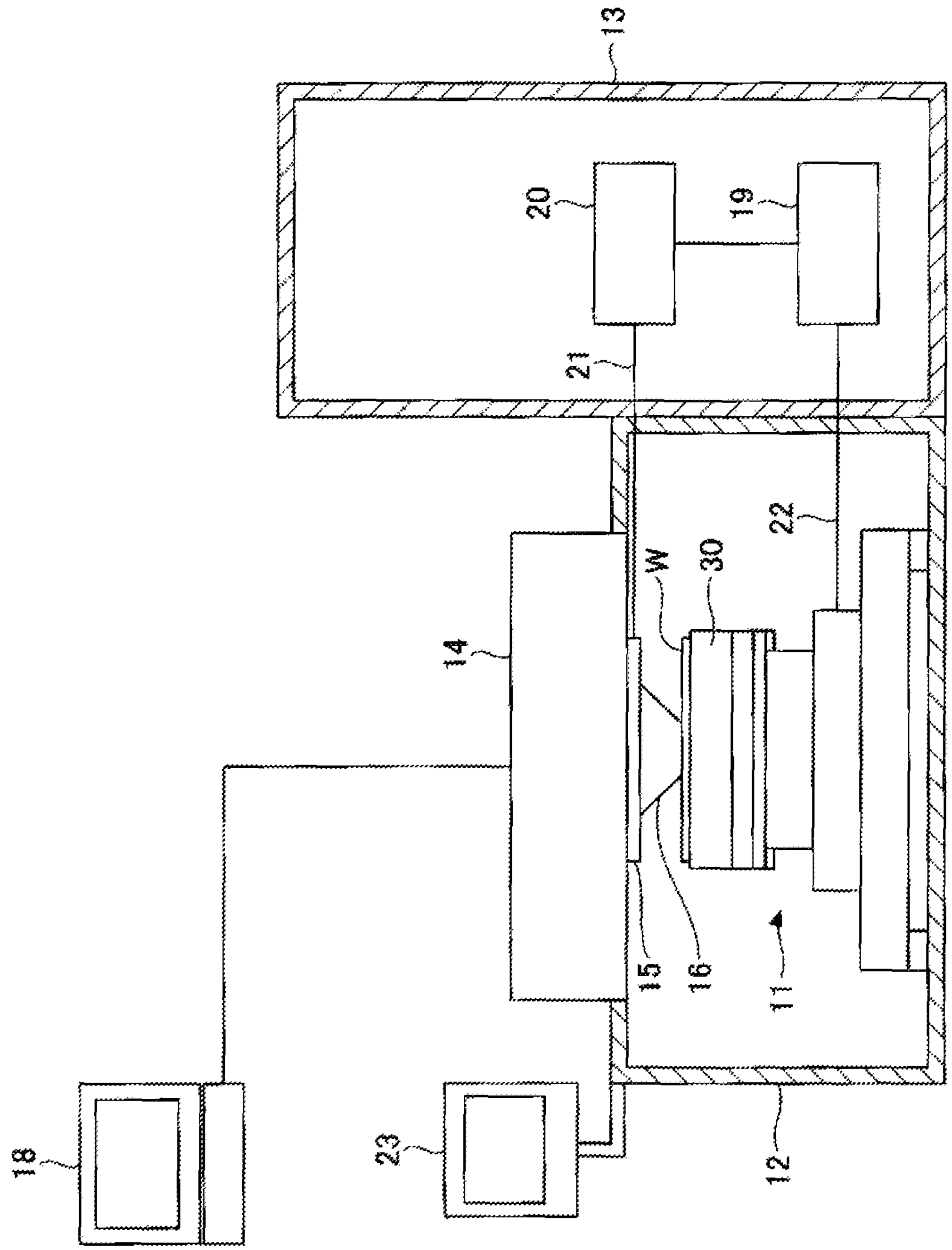
FIG. 2 is a front view of the electronic-device inspection apparatus according to the present embodiment.

FIG. 1 is a perspective view of an electronic-device inspection apparatus 10, which is an example of an electronic-device inspection apparatus according to the present embodiment. FIG. 2 is a front view of the electronic-device inspection apparatus 10, which is an example of the electronic-device inspection apparatus according to the present embodiment. Further, FIG. 2 schematically shows, in partial cross-section, components contained in the electronic-device inspection apparatus 10.

The electronic-device inspection apparatus 10 inspects the electrical characteristics of a plurality of electronic devices formed on a wafer W. The electronic-device inspection apparatus 10 includes an accommodation chamber 12, a loader 13, and a tester 14.

The accommodation chamber 12 has the shape of a hollow housing. The accommodation chamber 12 accommodates a stage 11 therein. The accommodation chamber 12 also has a probe card 15 therein. The probe card 15 includes a plurality of needle-like probes 16 arranged to correspond to electrode pads or solder bumps corresponding to electrodes of the electronic devices on the wafer W.

The wafer W is secured to the stage 11 so that its position relative to the stage 11 is not dislodged. The stage 11 is provided with an LED chuck 30. By the LED chuck 30, the wafer W is secured to the stage 11. The stage 11 is moved horizontally and vertically. The stage 11 adjusts a relative position between the probe card 15 and the wafer W. Further, the electrode pad or solder bump provided to correspond to the electrode of each electronic device of the wafer W contacts each probe 16 of the probe card 15.

The loader 13 takes the wafer W on which the electronic device is disposed out from a Front Opening Unify Pod (FOUP), which is a transfer container, and places the wafer on the stage 11 inside the accommodation chamber 12. Further, the loader 13 removes the wafer W that has been inspected from the stage 11 and accommodates the wafer in the FOUP.

The probe card 15 is connected to the tester 14. When each probe 16 contacts the electrode pad or solder bump provided to correspond to the electrode of each electronic device of the wafer W, each probe 16 supplies power from the tester 14 to each electronic device. Further, each probe 16 transmits a signal from the electronic device to the tester 14.

The tester 14 has a test board (not shown) that reproduces part of a circuit configuration of a motherboard on which the electronic device is mounted. Further, the test board of the tester 14 is connected to a tester computer 18 to determine whether the electronic device is good or bad on the basis of the signal from the electronic device. By replacing the test board in the tester 14, circuit configurations of multiple types of motherboards may be reproduced.

The loader 13 includes a base unit 19 as a controller that controls a power supply, and a potential difference measurement unit 20 that measures a potential difference in a potential difference generation circuit (not shown) in each electronic device, such as a diode, a transistor, or a resistor. The potential difference measurement unit 20 is connected to the probe card 15 via wiring 21. The potential difference measurement unit 20 acquires a potential difference between the two probes 16 contacting the two electrode pads corresponding to respective electrodes of the potential difference generation circuit, and transmits the acquired potential difference to the base unit 19.

The base unit 19 is connected to the stage 11 via wiring 22. This also controls the operation of the LED chuck 30 that will be described later.

The base unit 19 or the potential difference measurement unit 20 may be provided in the accommodation chamber 12, and the potential difference measurement unit 20 may be provided in the probe card 15.

The electronic-device inspection apparatus 10 is provided with a user interface 23. The user interface 23 includes a display panel such as a touch panel and a keyboard. A user inputs various pieces of information and instructions through the user interface 23.

When the electronic-device inspection apparatus 10 inspects the electrical characteristics of the electronic device, the tester computer 18 transmits data to the test board connected to the electronic device via each probe 16. Also, the tester computer 18 determines whether the transmitted data is correctly processed by the test board in response to an electrical signal from the test board.

<LED Chuck 30>

Figure 3:
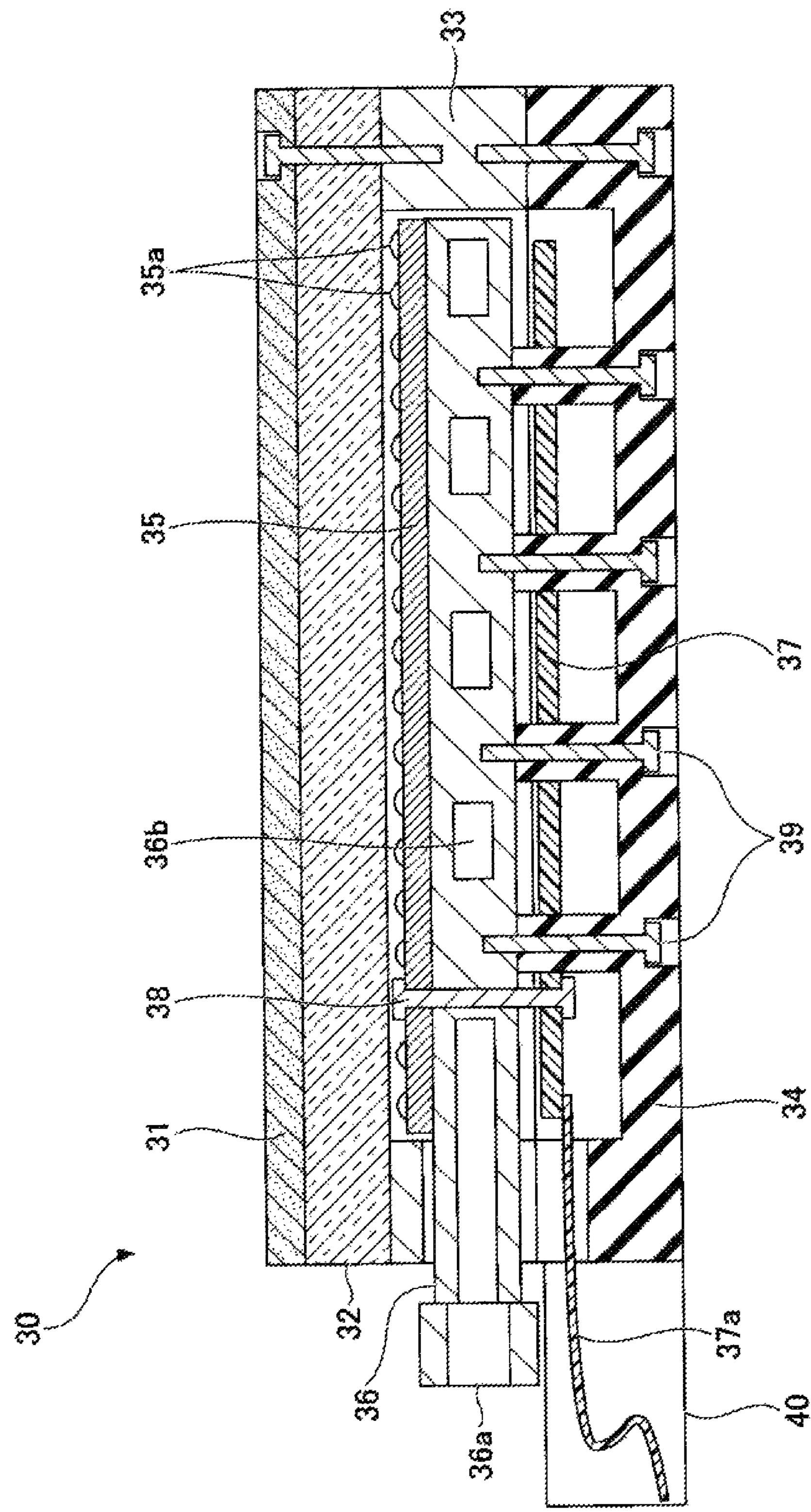
FIG. 3 is a sectional view of an LED chuck according to the present embodiment.

The LED chuck 30 according to the present embodiment will be described. FIG. 3 is a sectional view of the LED chuck 30 according to the present embodiment.

The LED chuck 30 has a heating function to control the temperature of the electronic device that is to be tested. The LED chuck 30 heats the electronic device with an LED 35*a*, which will be described later. The LED chuck 30 includes a top plate 31, a glass plate 32, an insulating ring 33, a base plate 34, an LED array substrate 35, a cooling plate 36, and an LED control substrate 37.

The wafer W that is an object to be inspected is mounted on the top plate 31. The top plate 31 is made of silicon carbide, for example. The top plate 31 has a mechanism for sucking the wafer W, which is the object to be inspected.

The top plate 31 is mounted on the glass plate 32. That is, the glass plate 32 is provided on the back side of the top plate 31 when viewed from above. The glass plate 32 is made of heat-resistant glass, for example. The glass plate 32 transmits light from the LED 35*a* mounted on the LED array substrate 35. The light transmitted through the LED 35*a* heats the top plate 31 and the wafer W mounted on the top plate 31.

The insulating ring 33 is a member that connects the glass plate 32 and the base plate 34. The insulating ring 33 has a hollow cylindrical shape. The cooling plate 36 and the LED control substrate 37 are provided in an internal space defined by the insulating ring 33, the glass plate 32 and the base plate 34. The insulating ring 33 is made of, for example, a low thermal expansion material.

The base plate 34 holds the cooling plate 36. The base plate 34 is made of ceramic, for example. The cooling plate 36 is secured to the base plate 34 using a screw 39.

The LED array substrate 35 is a substrate on which the LED 35*a* is mounted. The LED array substrate 35 holds the LED 35*a* and transfers heat generated from the LED 35*a* to the cooling plate 36. The LED array substrate 35 is made of aluminum, for example.

The cooling plate 36 cools the LED array substrate 35. The cooling plate 36 is formed of copper, for example. The cooling plate 36 has on a side surface thereof a coolant inlet 36*a*. The cooling plate 36 has a flow path 36*b* therein. A coolant introduced from the coolant inlet 36*a* passes through the flow path 36*b* and is discharged from a coolant outlet. The cooling plate 36 is cooled by the coolant passing through the flow path 36*b*.

The LED array substrate 35 is mounted on the cooling plate 36. That is, the cooling plate 36 is provided on the back side of the LED array substrate 35 when viewed from above.

The LED control substrate 37 is a substrate that is provided with a circuit for controlling the light emission of the LED 35*a* of the LED array substrate 35. The LED control substrate 37 is formed of, for example, a glass epoxy substrate. The LED control substrate 37 is secured to the cooling plate 36 by a power supply member 38. The LED control substrate 37 is provided on the back side of the cooling plate 36 when viewed from above. Further, the power supply member 38 supplies power from the LED control substrate 37 to the LED 35*a* of the LED array substrate 35. The LED control substrate 37 is disposed to be surrounded by the base plate 34.

Since the LED control substrate 37 includes a circuit that drives the LED 35*a* to switch between ON and OFF at high speed, noise is generated. In order to prevent noise generated from the LED control substrate 37 from being emitted to the outside of the LED chuck 30, in other words, to shield radiant noise from the LED control substrate 37, the LED chuck 30 includes a covering layer made of a magnetic material on a surface corresponding to the LED control substrate 37.

The covering layer made of the magnetic material will be described.

Figure 4:
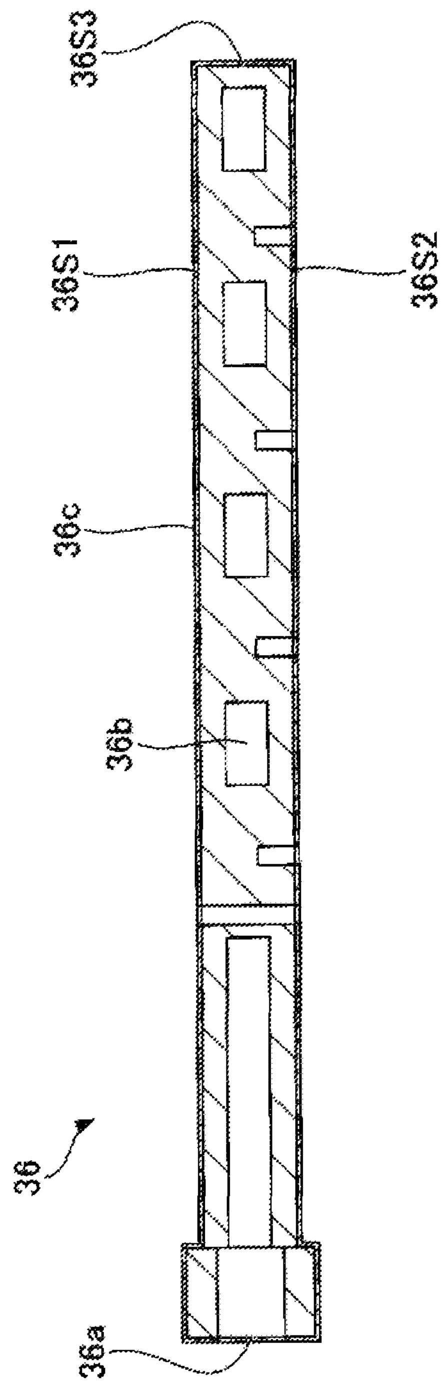
FIG. 4 is a sectional view of a cooling plate of the LED chuck according to the present embodiment.

FIG. 4 is a sectional view of the cooling plate 36 of the LED chuck 30 according to the present embodiment. The cooling plate 36 includes a covering layer 36*c* that is made of a magnetic material and is provided on an upper surface 36S1 on which the LED array substrate 35 is mounted, a lower surface 36S2 facing the LED control substrate 37, and a side surface 36S3 connecting the upper surface 36S1 and the lower surface 36S2. Further, the covering layer 36*c* is an example of a first covering layer.

Figure 5:
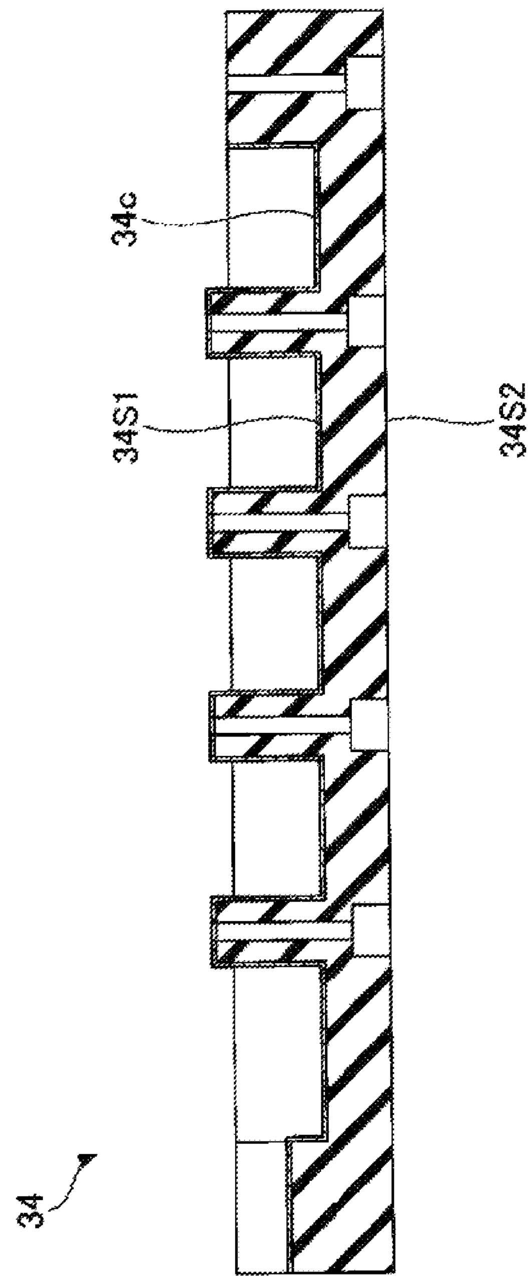
FIG. 5 is a sectional view of a base plate of the LED chuck according to the present embodiment.

FIG. 5 is a sectional view of the base plate 34 of the LED chuck 30 according to the present embodiment. The base plate 34 includes a covering layer 34*c* that is formed of a magnetic material and is provided on an upper surface 34S1 facing the LED control substrate 37. A covering layer of a magnetic material is not formed on a lower surface 34S2. Further, the covering layer 34*c* is an example of a second covering layer.

An example of the magnetic material forming the covering layer 36*c* and the covering layer 34*c* is nickel. The covering layer 36*c* and the covering layer 34*c* are formed of a plating layer of a magnetic material. That is, the covering layer 36*c* and the covering layer 34*c* are magnetic plating layers. As the covering layer 36*c* and the covering layer 34*c* are formed of the magnetic material, electric field noise and magnetic field noise, which are noise emitted from the LED control substrate 37, may be shielded.

Further, the base plate 34 may be made of magnetic metal. For example, the base plate 34 may be made of magnetic stainless steel. The shielding effect can be enhanced by forming the base plate 34 itself from the magnetic metal.

Further, the covering layers 36*c* and 34*c* may be formed of a plating layer of ferrite. That is, the covering layers 36*c* and 34*c* may be ferrite plating layers. High frequency noise can be suppressed using ferrite.

Alternatively, the covering layers 36*c* and 34*c* may be formed by attaching a magnetic shield sheet. Each covering layer may be easily mounted by attaching a sheet. Also, the material of the magnetic shield sheet may be appropriately selected according to the noise frequency.

Figure 6:
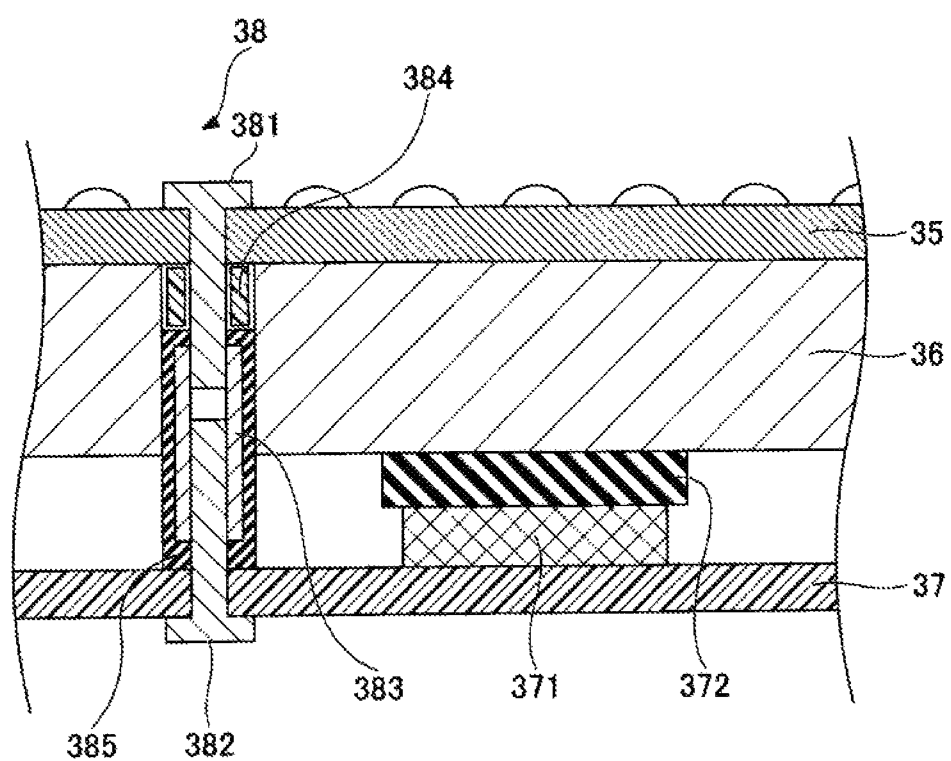
FIG. 6 is a sectional view of the LED chuck according to the present embodiment.

The connection between the LED array substrate 35 and the LED control substrate 37 will be described. FIG. 6 is a sectional view of the LED chuck 30 according to the present embodiment, particularly, an enlarged sectional view of a connecting portion between the LED array substrate 35 and the LED control substrate 37. The LED array substrate 35 and the LED control substrate 37 are electrically connected by the power supply member 38.

The power supply member 38 includes a screw 381, a screw 382, and a connecting member 383 that connects the screw 381 and the screw 382. The screw 381, the screw 382, and the connecting member 383 are formed of a conductive material. For example, the screw 381, the screw 382, and the connecting member 383 are formed of metal. A resin sleeve 384 is provided around the screw 381 to insulate it from the cooling plate 36. Further, a sleeve 385 for insulating the cooling plate 36 is provided around the connecting member 383.

The LED control substrate 37 is provided with an electronic component 371 for controlling the LED **35*a*. The electronic component 371 is a component that generates heat. In order to cool the electronic component 371, the electronic component 371 is thermally connected to the cooling plate 36 via the thermal conductive sheet 372**.

A connection cable **37*a* is connected to the LED control substrate 37. A shield 40 is provided around the connection cable 37*a*. By providing the shield 40, noise emitted from the connection cable 37*a* may be reduced to less than half. The shield 40 is formed of stainless steel, for example. Further, the connection cable 37*a*** may be covered with a magnetic shield sheet.

It should be noted that various embodiments of the present disclosure are merely illustrative in all respects and not restrictive. The embodiments may be omitted, substituted, or modified in various ways without departing from the scope and spirit of the appended claims.

This application claims priority from JP Patent Application No. 2021-057160 filed on Mar. 30, 2021 with the Japan Patent Office, the entire contents of which are hereby incorporated by reference.

DESCRIPTION OF REFERENCE NUMERALS

30: LED chuck
31: top plate
32: glass plate
33: insulating ring
34: base plate
**34*c***: covering layer
34S1: upper surface
34S2: lower surface
35: LED array substrate
36: cooling plate
**36*c***: covering layer
36S1: upper surface
36S2: lower surface
36S3: side surface
37: LED control substrate
**37*a***: connection cable
38: power supply member
40: shield
371: electronic component
372: thermal conductive sheet
W: wafer

The invention claimed is:

1. A light emitting diode (LED) chuck comprising:

a top plate on which an object to be inspected is mounted;

a LED array substrate disposed to face the object to be inspected, the LED array substrate including a plurality of LEDs for heating the object to be inspected that is mounted on the top plate;

a cooling plate disposed on a back side of the LED array substrate;

a LED control substrate disposed on a back side of the cooling plate and controlling the plurality of LEDs; and a base plate disposed to surround the LED control substrate, wherein a surface of the cooling plate facing the LED control substrate and a surface of the base plate facing the LED control substrate are formed of a magnetic material.

2. The LED chuck of claim 1, wherein the surface of the cooling plate facing the LED control substrate has a first covering layer formed of the magnetic material.

3. The LED chuck of claim 2, wherein the first covering layer is a magnetic plating layer.

4. The LED chuck of claim 3, wherein the surface of the base plate facing the LED control substrate has a second covering layer formed of the magnetic material.

5. The LED chuck of claim 4, wherein the second covering layer is a magnetic plating layer.

6. The LED chuck of claim 2, wherein the surface of the base plate facing the LED control substrate has a second covering layer formed of the magnetic material.

7. The LED chuck of claim 6, wherein the second covering layer is a magnetic plating layer.

8. The LED chuck of claim 1, wherein the surface of the base plate facing the LED control substrate has a second covering layer formed of the magnetic material.

9. The LED chuck of claim 8, wherein the second covering layer is a magnetic plating layer.

10. The LED chuck of claim 1, wherein the magnetic material is nickel.

11. The LED chuck of claim 1, wherein the base plate is formed of ceramic.

12. The LED chuck of claim 1, further comprising:

a connection cable connected to the LED control substrate, wherein the connection cable is covered by a shield.

13. The LED chuck of claim 1, wherein an electronic component mounted on the LED control substrate is secured to the cooling plate via a thermal conductive sheet.

* * * * *